(12) United States Patent
Wang et al.

(10) Patent No.: US 11,316,024 B2
(45) Date of Patent: Apr. 26, 2022

(54) SPLIT-GATE NON-VOLATILE MEMORY CELLS WITH ERASE GATES DISPOSED OVER WORD LINE GATES, AND METHOD OF MAKING SAME

(71) Applicant: Silicon Storage Technology, Inc., San Jose, CA (US)

(72) Inventors: Chunming Wang, Shanghai (CN); Xian Liu, Sunnyvale, CA (US); Guo Xiang Song, Shanghai (CN); Leo Xing, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/165,934

(22) Filed: Feb. 2, 2021

(65) Prior Publication Data

US 2022/0102517 A1   Mar. 31, 2022

(30) Foreign Application Priority Data

Sep. 30, 2020   (CN) .......................... 202011060967.0

(51) Int. Cl.

| G11C 11/34 | (2006.01) |
|---|---|
| H01L 29/423 | (2006.01) |
| H01L 29/788 | (2006.01) |
| H01L 29/66 | (2006.01) |
| G11C 16/04 | (2006.01) |

(52) U.S. Cl.
CPC .... H01L 29/42328 (2013.01); G11C 16/0433 (2013.01); H01L 29/66825 (2013.01); H01L 29/788 (2013.01)

(58) Field of Classification Search
CPC .............. G11C 11/223; G11C 11/2273; G11C 11/2275; H01L 27/1159; H01L 29/6684
See application file for complete search history.

(56) References Cited

U.S. PATENT DOCUMENTS

| 5,029,130 A | 7/1991 | Yeh |
|---|---|---|
| 6,747,310 B2 | 6/2004 | Fan et al. |

(Continued)

FOREIGN PATENT DOCUMENTS

CN   106 206 588   12/2016

OTHER PUBLICATIONS

PCT Search Report and Written Opinion dated May 31, 2021 for the related PCT Patent Application No. PCT/US2021/017005.

*Primary Examiner* — Viet Q Nguyen
(74) *Attorney, Agent, or Firm* — DLA Piper LLP (US)

(57) ABSTRACT

A memory device, and method of making the same, that includes a substrate of semiconductor material of a first conductivity type, first and second regions spaced apart in the substrate and having a second conductivity type different than the first conductivity type, with a first channel region in the substrate extending between the first and second regions, a first floating gate disposed over and insulated from a first portion of the first channel region adjacent to the second region, a first coupling gate disposed over and insulated from the first floating gate, a first word line gate disposed over and insulated from a second portion of the first channel region adjacent the first region, and a first erase gate disposed over and insulated from the first word line gate.

8 Claims, 13 Drawing Sheets

(56) References Cited

U.S. PATENT DOCUMENTS

| | | | |
|---|---|---|---|
| 6,906,379 B2* | 6/2005 | Chen | H01L 27/115 257/315 |
| 7,227,217 B2* | 6/2007 | Levi | H01L 27/115 257/315 |
| 7,800,159 B2* | 9/2010 | Widjaja | H01L 27/115 257/316 |
| 8,711,636 B2 | 4/2014 | Do et al. | |
| 8,883,592 B2* | 11/2014 | Kotov | H01L 29/42328 438/267 |
| 9,275,748 B2 | 3/2016 | Do et al. | |
| 9,466,932 B2* | 10/2016 | Hou | H01R 13/6633 |
| 9,634,019 B1* | 4/2017 | Zhou | H01L 29/42328 |
| 9,634,020 B1* | 4/2017 | Su | H01L 27/1203 |
| 9,953,719 B2* | 4/2018 | Tran | G11C 16/3418 |
| 9,972,632 B2* | 5/2018 | Wang | G11C 16/16 |
| 10,217,850 B2* | 2/2019 | Zhou | H01L 29/40114 |
| 10,312,246 B2* | 6/2019 | Yang | H01L 29/401 |
| 10,312,248 B2* | 6/2019 | Tran | G11C 16/14 |
| 10,418,451 B1* | 9/2019 | Do | H01L 23/53271 |
| 10,586,595 B2* | 3/2020 | Qian | G11C 16/0425 |
| 10,600,484 B2* | 3/2020 | Tiwari | G11C 11/5628 |
| 10,608,090 B2* | 3/2020 | Yang | H01L 29/40114 |
| 10,658,027 B2* | 5/2020 | Do | G11C 16/0458 |
| 10,714,489 B2* | 7/2020 | Tkachev | H01L 27/11521 |
| 10,714,634 B2* | 7/2020 | Yang | H01L 27/11521 |
| 10,797,142 B2* | 10/2020 | Jourba | H01L 29/1037 |
| 10,838,652 B2* | 11/2020 | Markov | G11C 16/0425 |
| 10,879,252 B2* | 12/2020 | Xing | H01L 29/42328 |
| 10,956,814 B2* | 3/2021 | Tran | G06N 3/08 |
| 2005/0012137 A1 | 1/2005 | Levi et al. | |
| 2013/0032872 A1* | 2/2013 | Kotov | H01L 27/11521 257/319 |
| 2015/0035040 A1* | 2/2015 | Yoo | H01L 29/40114 257/320 |
| 2016/0043095 A1* | 2/2016 | Yang | H01L 27/11521 257/319 |
| 2017/0040334 A1 | 2/2017 | Cheng et al. | |
| 2019/0206882 A1 | 7/2019 | Macpeak | |

* cited by examiner

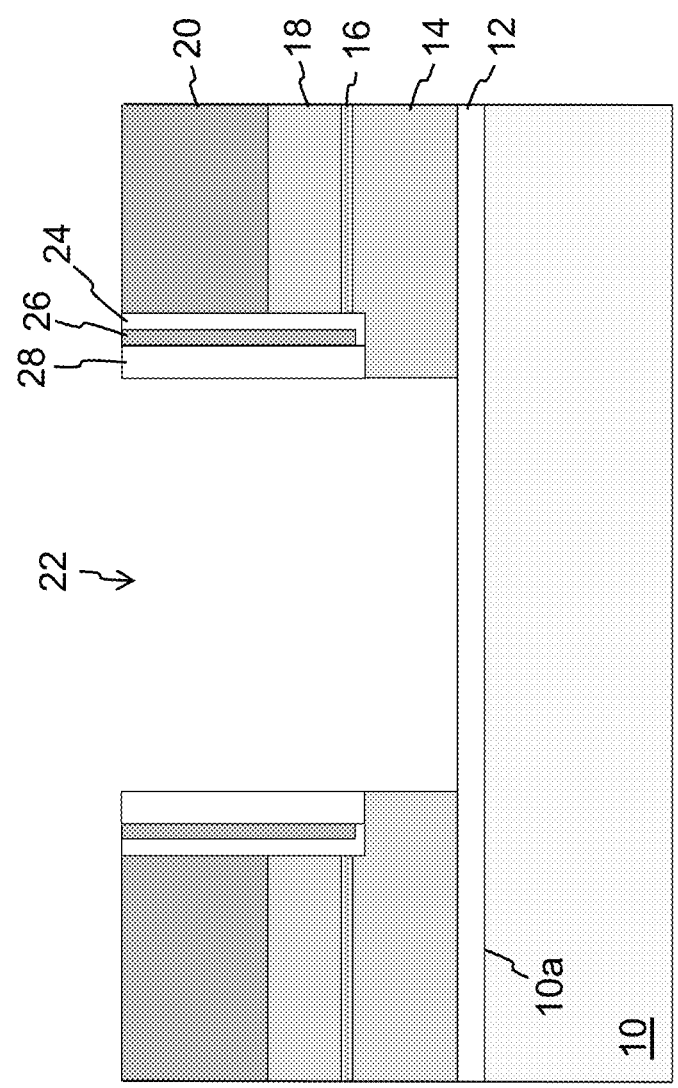

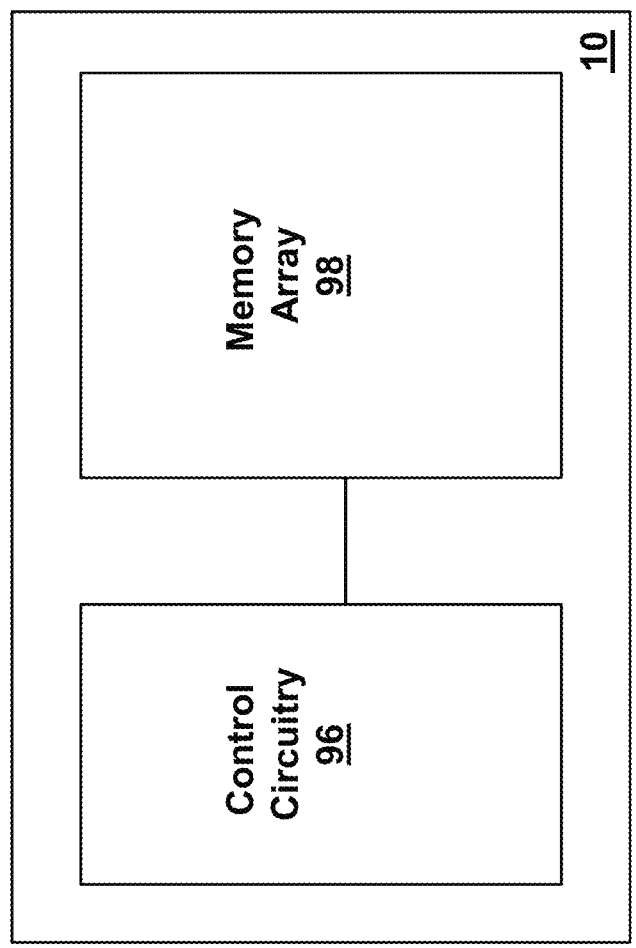

SPLIT-GATE NON-VOLATILE MEMORY CELLS WITH ERASE GATES DISPOSED OVER WORD LINE GATES, AND METHOD OF MAKING SAME

PRIORITY CLAIM

This patent application claims priority to Chinese Patent Application No. 202011060967.0, filed on Sep. 30, 2020, entitled "Split-Gate Non-volatile Memory Cells With Erase Gates Disposed Over Word Line Gates, And Method Of Making Same."

FIELD OF THE INVENTION

The present invention relates to non-volatile memory arrays, and more particularly to a split gate, memory cell design and method of manufacture.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. The memory cell is shown in FIG. 1. Each memory cell 110 includes source and drain regions 114/116 formed in a semiconductor substrate 112, with a channel region 118 there between. A floating gate 120 is formed over and insulated from (and controls the conductivity of) a first portion of the channel region 118, and over a portion of the drain region 116. A control gate 122 has a first portion 122a that is disposed over and insulated from (and controls the conductivity of) a second portion of the channel region 118, and a second portion 122b that extends up and over the floating gate 120. The floating gate 120 and control gate 122 are insulated from the substrate 112 by a gate oxide 126.

The memory cell is erased (where electrons are removed from the floating gate) by placing a high positive voltage on the control gate 122, which causes electrons on the floating gate 120 to tunnel through the intermediate insulation 123 from the floating gate 120 to the control gate 122 via Fowler-Nordheim tunneling.

The memory cell is programmed (where electrons are placed on the floating gate) by placing a positive voltage on the control gate 122, and a positive voltage on the drain region 116. Electron current will flow from the source region 114 towards the drain region 116. The electrons will accelerate and become heated when they reach the gap between the control gate 122 and the floating gate 120. Some of the heated electrons will be injected through the gate oxide 126 onto the floating gate 120 due to the attractive electrostatic force from the floating gate 120.

The memory cell is read by placing positive read voltages on the drain region 116 and control gate 122 (which turns on the channel region 118 under the control gate first portion 122a). If the floating gate 120 is positively charged (i.e. erased of electrons and positively coupled to the drain region 116), then the portion of the channel region 118 under the floating gate 120 is turned on as well, and current will flow across the channel region 118, which is sensed as the erased or "1" state. If the floating gate 120 is negatively charged (i.e. programmed with electrons), then the portion of the channel region under the floating gate 120 is mostly or entirely turned off, and current will not flow (or there will be little flow) across the channel region 118, which is sensed as the programmed or "0" state. Those skilled in the art understand that the source and drain regions can be interchangeable, where the floating gate 120 can extend partially over the source region 114 instead of the drain region 116, as shown in FIG. 2.

Split gate memory cells having more than two gates are also known. For example, U.S. Pat. No. 8,711,636 ("the '636 patent") discloses memory cells with an additional coupling gate disposed over and insulated from the source region, for better capacitive coupling to the floating gate. See for example FIG. 3 showing coupling gate 124 disposed over source region 14.

A four gate memory disclosed in U.S. Pat. No. 6,747,310 ("the '310 patent"). For example, as shown in FIG. 4, the memory cells have source region 114, drain region 116, floating gate 120 over a first portion of channel region 118, a select (word line) gate 128 over a second portion of the channel region 118, a control gate 122 over the floating gate 120, and an erase gate 130 over the source region 14. Programming is shown by heated electrons from the channel region 118 injecting themselves onto the floating gate 120. Erasing is shown by electrons tunneling from the floating gate 120 to the erase gate 130 by placing a positive voltage on the erase gate 130 (and optionally a negative voltage on the control gate 122). However, this configuration is not ideal because erase efficiency can be compromised by the high coupling ratio between the erase gate and the floating gate, and it can be complex to manufacture.

Conventional memory cell designs and methods of fabrication make it challenging to scale the memory cells down in size while maintaining or even enhancing performance, and streamlining fabrication processes.

BRIEF SUMMARY OF THE INVENTION

The aforementioned problems and needs are addressed by a memory device that includes a substrate of semiconductor material of a first conductivity type, first and second regions spaced apart in the substrate and having a second conductivity type different than the first conductivity type, with a first channel region in the substrate extending between the first and second regions, a first floating gate disposed over and insulated from a first portion of the first channel region adjacent to the second region, a first coupling gate disposed over and insulated from the first floating gate, a first word line gate disposed over and insulated from a second portion of the first channel region adjacent the first region, and a first erase gate disposed over and insulated from the first word line gate.

A method of forming memory cells includes forming a first insulation layer on a semiconductor substrate having a first conductivity type, forming a first conductive layer on the first insulation layer, forming a second insulation layer on the first conductive layer, forming a second conductive layer on the second insulation layer, forming a third insulation layer on the second conductive layer, forming a trench that extends through the third insulation layer, the second conductive layer, and the second insulation layer, forming insulation spacers along a sidewall of the trench, extending the trench through the first conductive layer between the insulation spacers, forming a first block of conductive material in the trench, wherein the first block of conductive material is disposed vertically over and insulated from the substrate and laterally adjacent to and insulated from the first conductive layer, forming first and second erase gates in the trench, wherein the first and second erase gates are disposed vertically over and insulated from the first block of conductive material, removing a portion of the first block of conductive material between the first and second erase gates, while maintaining first and second portions of the first block of conductive material as respective first and second word line gates, forming a first region in a portion of the substrate between the first and second word line gates and having a second conductivity type different than the first conductivity type, removing portions of the second conductive layer while maintaining first and second portions of the second conductive layer as respective first and second coupling gates, removing portions of the first conductive layer while maintaining first and second portions of the first conductive layer as respective first and second floating gates, and forming second and third regions in the substrate and having the second conductivity type, wherein the second region is adjacent to the first floating gate and the third region is adjacent to the second floating gate, wherein a first channel region in the substrate extends between the first and second regions and a second channel region in the substrate extends between the first and third regions. The first floating gate is disposed over and insulated from the substrate and laterally adjacent to and insulated from the first word line gate. The second floating gate is disposed over and insulated from the substrate and laterally adjacent to and insulated from the second word line gate. The first coupling gate is disposed over and insulated from the first floating gate. The second coupling gate is disposed over and insulated from the second floating gate. The first erase gate is disposed over and insulated from the first word line gate. The second erase gate is disposed over and insulated from the second word line gate.

Other objects and features of the present invention will become apparent by a review of the specification, claims and appended figures.

BRIEF DESCRIPTION OF THE DRAWINGS

FIGS. 5A-5F are side cross section views showing the steps in forming a pair of memory cells according to the present invention.

FIG. 8 is a plan view showing control circuitry used to operate an array of memory cells of the present invention.

DETAILED DESCRIPTION OF THE INVENTION

Figure 2:
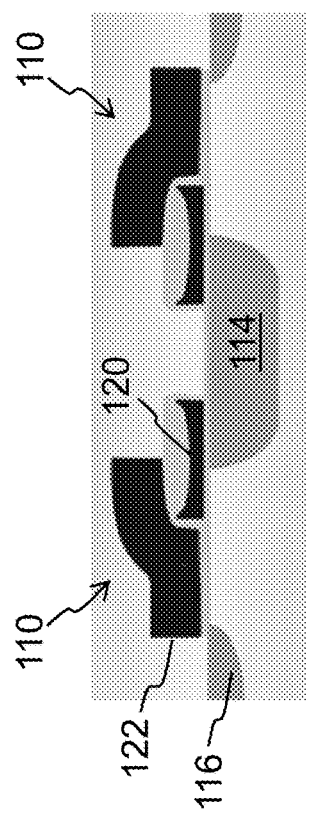
FIG. 2 is a cross sectional view of a conventional two-gate memory cell.
Figure 1:
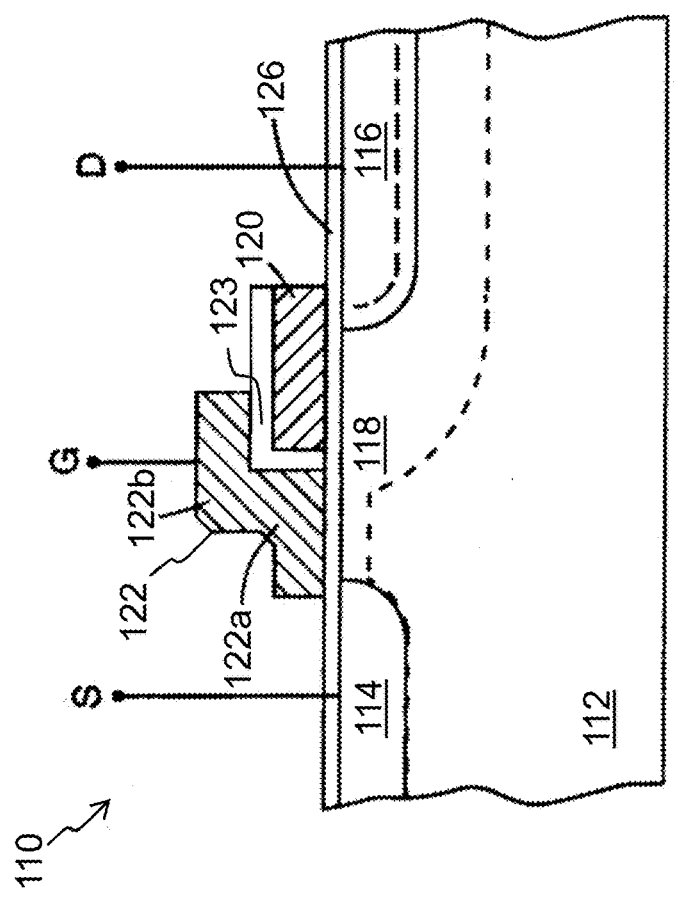
FIG. 1 is a cross sectional view of a conventional two-gate memory cell.
Figure 3:
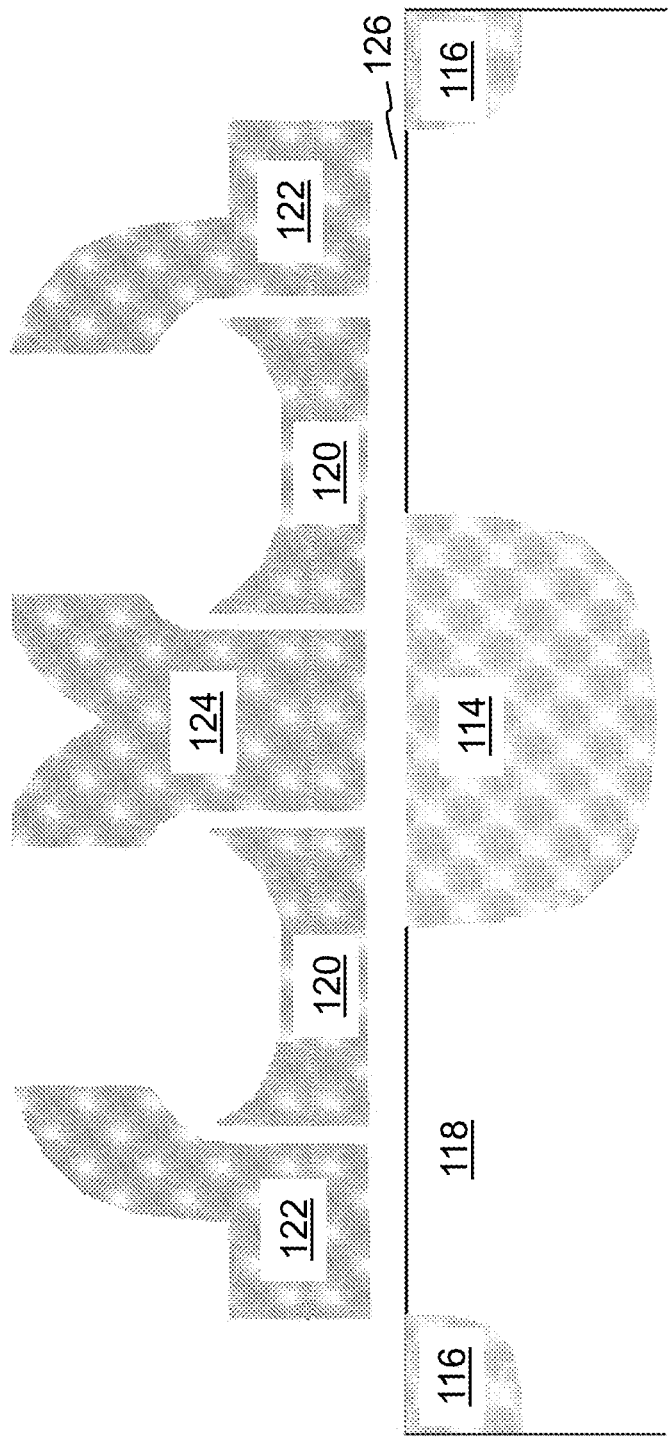
FIG. 3 is a cross sectional view of a conventional three-gate memory cell.
Figure 4:
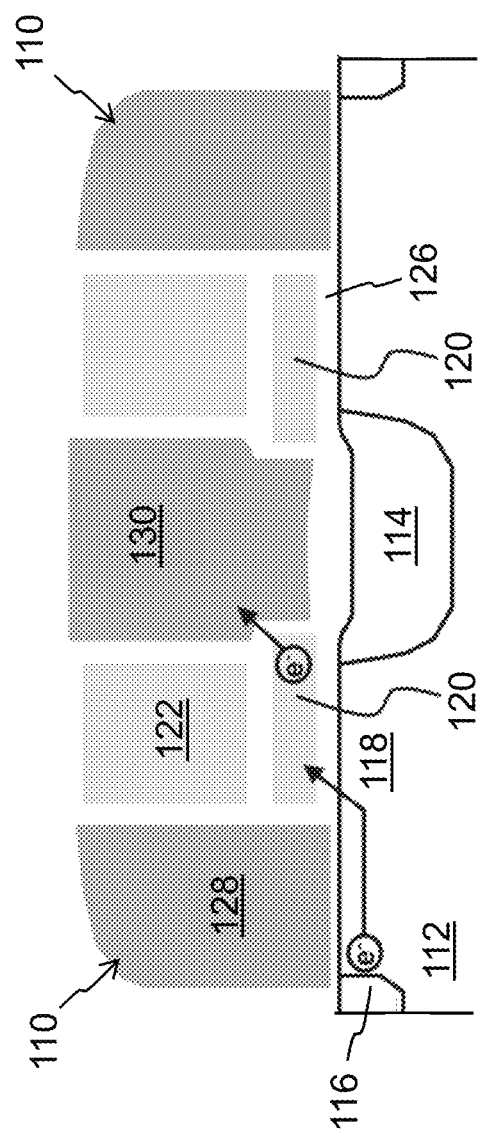
FIG. 4 is a cross sectional view of a conventional four-gate memory cell.
Figure 5A:
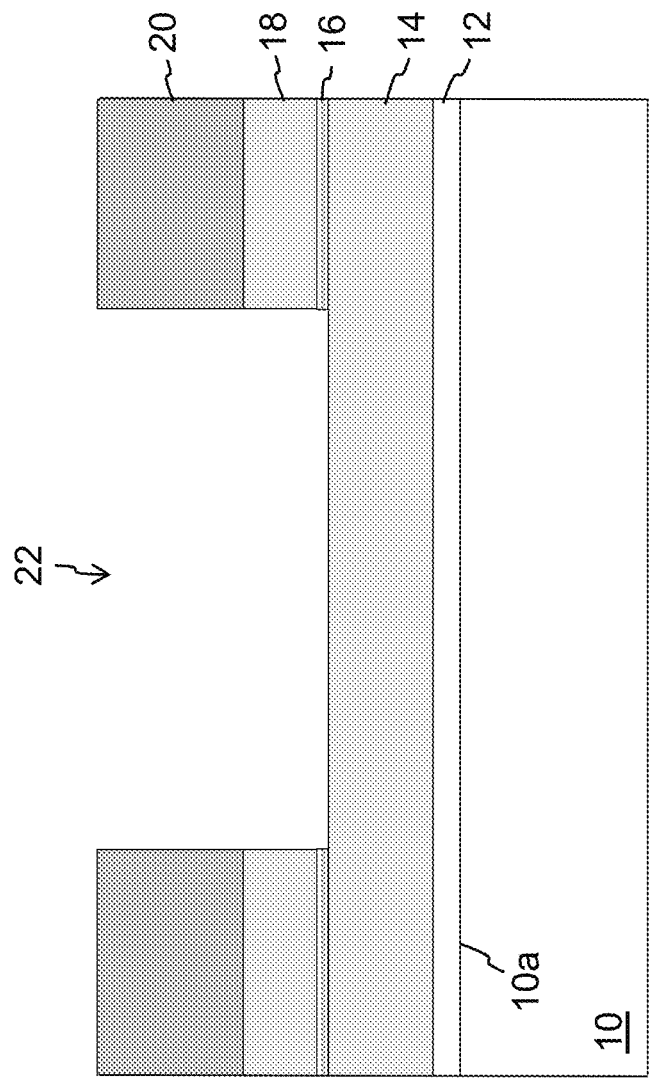

The present invention is a memory cell design, architecture and method of manufacture of a split-gate, memory cell design. Referring to FIGS. 5A-5F, there are shown cross-sectional views of the steps in the process to make a memory cell. While only the formation of a pair of memory cells is shown in the figures, it should be understood that an array of such memory cell pairs are formed concurrently when forming a memory device containing an array of such memory cells. The process begins by forming a first insulation layer 12 (e.g. layer of silicon dioxide, also referred to herein as oxide layer 12) on the top surface 10a of a substrate 10 of semiconductor material (e.g., single crystalline silicon). Thereafter, a first conductive layer 14 (e.g. polysilicon (also referred to herein as "poly") or amorphous silicon) is formed on the oxide layer 12. A second insulation layer 16 is formed on first conductive layer 14. Preferably, second insulation layer 16 is an ONO layer, meaning it has oxide-nitride-oxide sublayers. A second conductive layer 18 (e.g. polysilicon or amorphous silicon) is formed on second insulation layer 16. A third insulation layer 20 (e.g. silicon nitride—referred to herein as "nitride") is formed on second conductive layer 18. Photoresist material (not shown) is coated on the structure, and a photolithography masking step is performed exposing selected portions of the photoresist material. The photoresist is developed such that portions of the photoresist are removed. Using the remaining photoresist as a mask, the structure is etched. Specifically, third insulation layer 20, second conductive layer 18 and second insulation layer 16 are anisotropically etched (using conductive layer 14 as an etch stop), leaving a trench 22 extending through third insulation layer 20, second conductive layer 18 and second insulation layer 16. The resulting structure is shown in FIG. 5A (after photoresist removal).

Insulation spacers 24/26 (e.g., ON—oxide and nitride, respectively) spacers 24/26 are formed along the sidewalls of trench 22. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface, not shown). Insulation (ON) spacers 24/26 are formed by oxide deposition, nitride deposition, and then nitride anisotropic etch and oxide anisotropic etch. Oxide spacers 28 are then formed in trench 22 by oxide deposition followed by oxide anisotropic etch. An anisotropic etch is then performed to remove the exposed portion of first conductive layer 14 below the area located between oxide spacers 28, as shown in FIG. 5B, deepening trench 22. An implantation may be performed at this time (through oxide layer 12 at the bottom of trench 22 and into the portion of the substrate 10 underneath (which will eventually be the word line portion of the channel region as described further below).

Figure 5C:
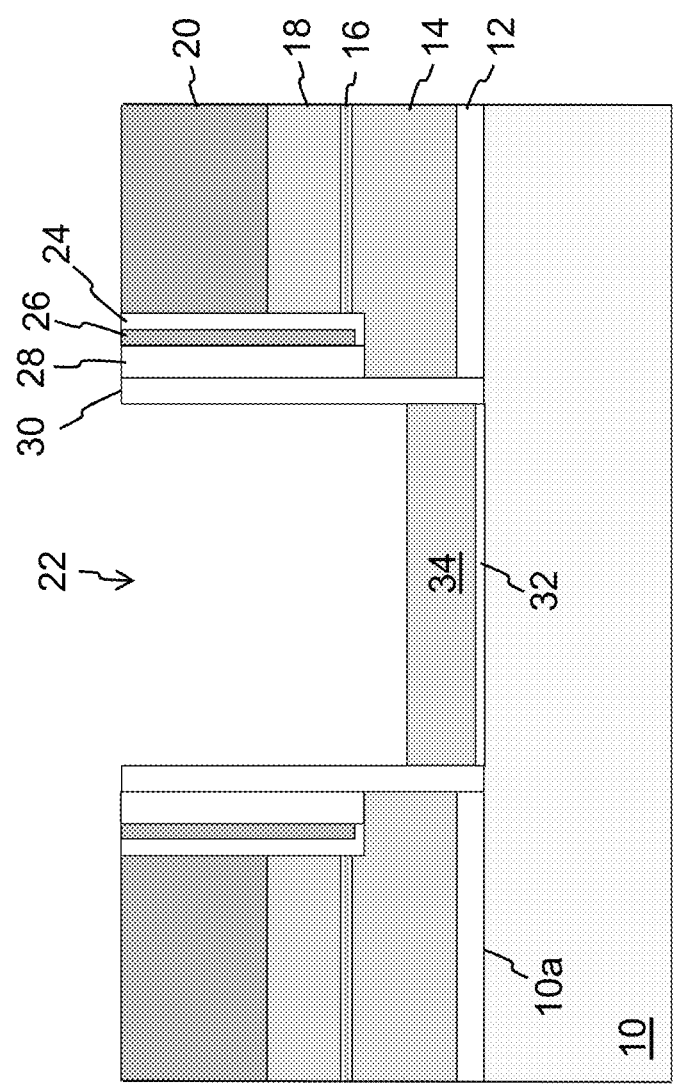

Oxide spacers 30 are next formed along the sidewalls of trench 22 (including along the exposed sidewalls of first conductive layer 14 and adjacent oxide spacers 28) by oxide deposition and anisotropic oxide etch. This spacer formation, particularly the anisotropic oxide etch which removes the portion of oxide layer 12 at the bottom of trench 22, leaves the portion of the substrate surface 10a between oxide spacers 30 exposed. Oxide layer 32 is formed on this exposed portion of the substrate surface 10a at the bottom of trench 22, preferably by thermal oxidation. Also preferably oxide layer 32 has a thickness that is less than that of oxide layer 12. A first block of conductive material 34 is formed on oxide layer 32 inside trench 22 by material deposition, a chemical mechanical polish (CMP) using third insulation layer 20 as a stop layer, and etch back. Preferably, the first block of conductive material 34 is formed of polysilicon, and the top surface of the first block of conductive material 34 is below the top surface of the first conductive layer 14. The first block of conductive material 34 is laterally adjacent to, and insulated from, first conductive layer 14 by oxide spacers 30. An implantation can be performed to dope the first block of conductive material 34 should polysilicon be used for the first block of conductive material 34. The resulting structure is shown in FIG. 5C.

Figure 5D:
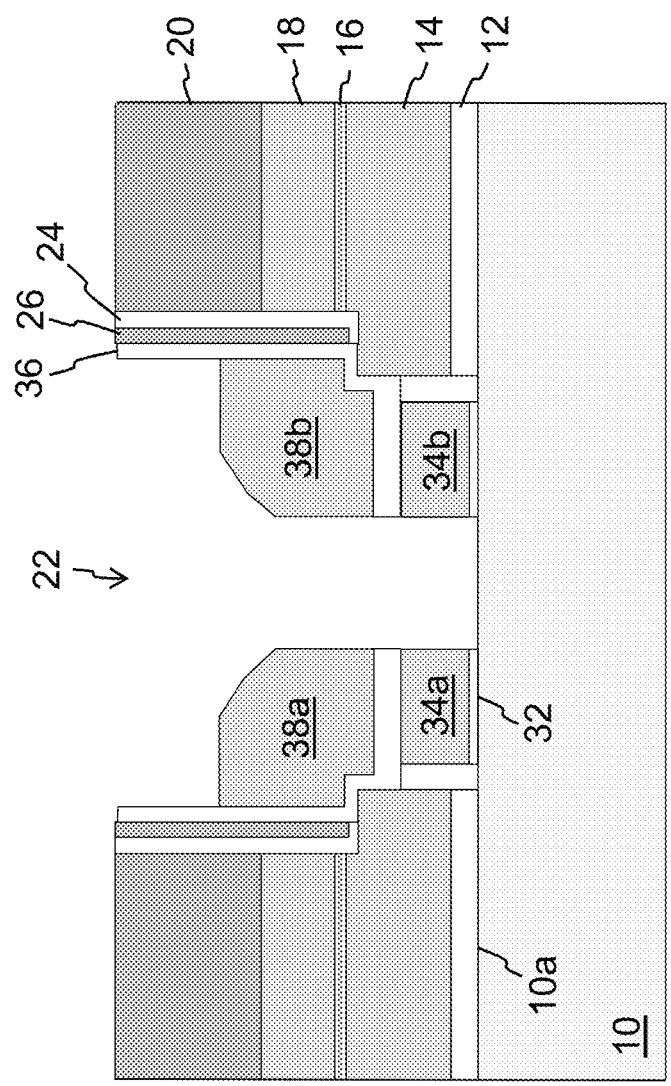

An oxide etch (e.g., wet etch) is used to remove the upper portions of oxide spacers 30 (above the first block of conductive material 34) and all of oxide spacers 28. An oxide layer 36 is then formed over the structure by oxide deposition. Second and third blocks of conductive material 38a/38b are formed on oxide layer 36 inside trench 22 by material deposition and etch. Preferably, second and third blocks of conductive material 38a/38b are a pair of spaced apart spacers formed by polysilicon deposition and anisotropic etch, leaving the portion of oxide layer 36 between the second and third blocks of conductive material 38a/38b exposed. An oxide etch is used to remove the exposed portion of oxide layer 36 at the bottom of the trench 22 between the second and third blocks of conductive material (e.g., by anisotropic etch), leaving a portion of the first block of conductive material 34 exposed. An etch is then used to remove the exposed (middle) portion of the first block of conductive material 34, resulting in fourth and fifth blocks of conductive material 34a/34b remaining from the first block of conductive material 34. The resulting structure is shown in FIG. 5D.

Figure 5E:
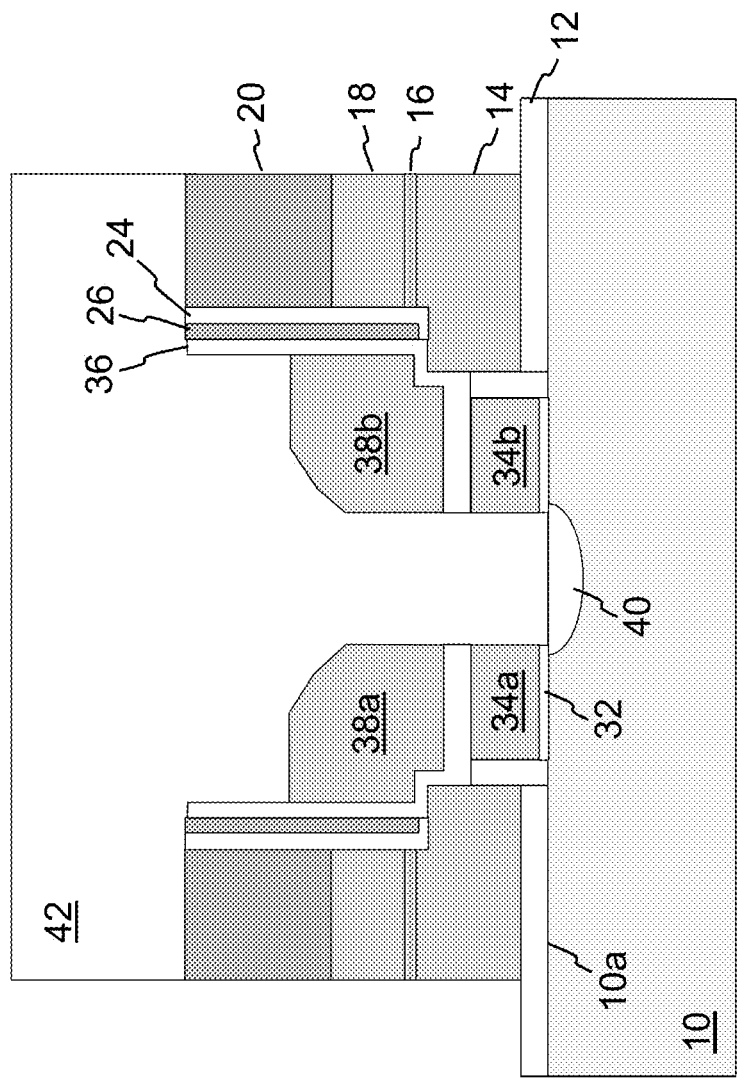
Figure 5F:
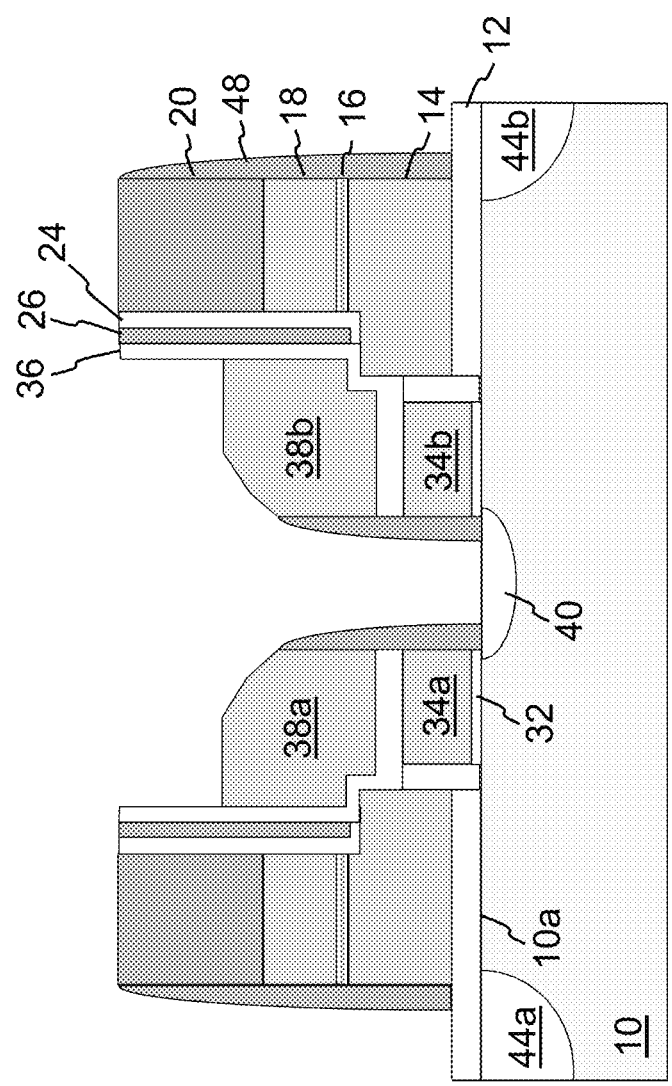

An implantation is then performed to form drain region 40 in the substrate 10 between the fourth and fifth blocks of conductive material 34a/34b. Drain region 40 is a first region in the substrate 10 having a conductivity type different from that of the substrate 10 in the vicinity of the drain region 40. Photoresist material 42 is coated on the structure, and a photolithography masking step is performed exposing selected portions of the photoresist material. The photoresist material 42 is developed such that portions of the photoresist material 42 are removed (except for photoresist material 42 in trench 22, over the second and third blocks of conductive material 38a/38b, over layer 36, over spacers 24/26, and over portions of third insulation layer 20 adjacent the second and third blocks of conductive material 38a/38b). Using the remaining photoresist material 42 as a mask, the structure is etched to remove the exposed portions of third insulation layer 20, second conductive layer 18, second insulation layer 16 and first conductive layer 14, as shown in FIG. 5E. An implantation is then performed to form first and second source regions 44a and 44b in the substrate 10 adjacent the outer edges first conductive layer 14. First and second source regions 44a/44b are second and third regions in the substrate that have the same conductivity type as that of drain region 40 (i.e., different from that of the substrate 10 in the vicinity of the first and second source regions 44a/44b), and extend partially under the respective adjacent first conductive layer 14. For example, the substrate 10 in the vicinity of first and second source regions 44a/44b and drain region 40 can be P type conductivity, and the first and second source regions 44a/44b and drain region 40 can be N type conductivity, and vice-versa. After removing photoresist 42, insulation spacers 48 (e.g., nitride) can be formed on the sides of the structure, as shown in FIG. 5F.

Figure 6:
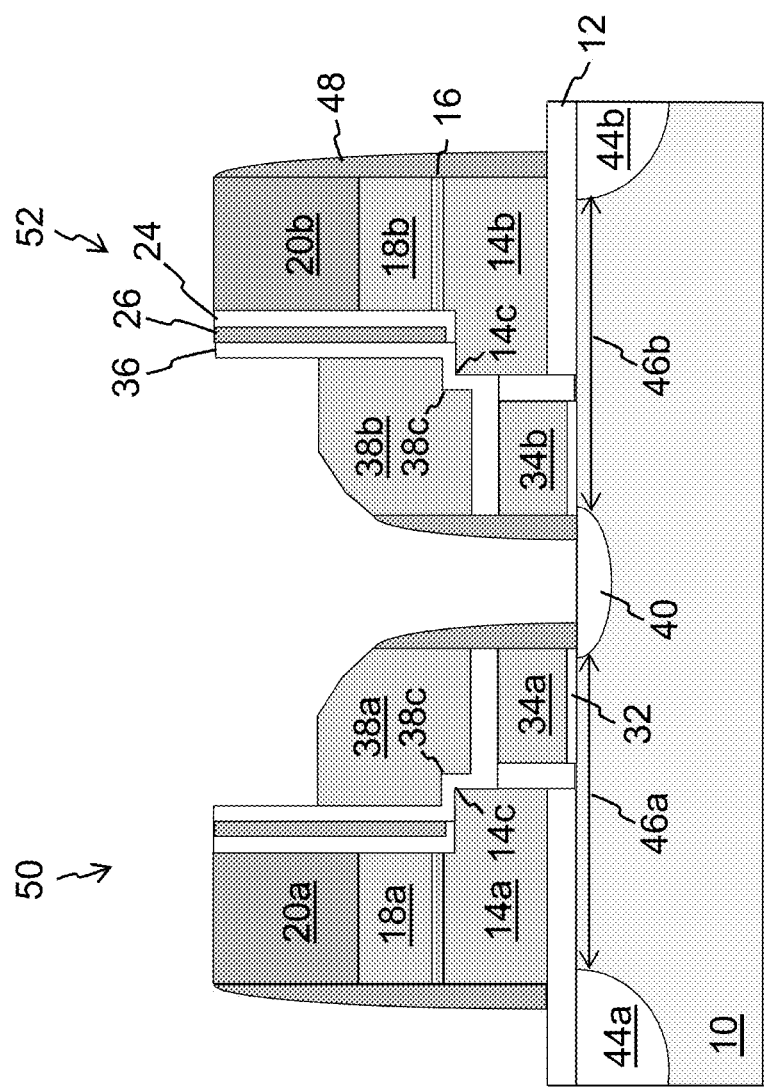
FIG. 6 is a side cross section view showing the final structure of the pair of memory cells of the present invention.

The resulting memory cells are best shown in FIG. 6, where a pair of memory cells, i.e. memory cells 50 and 52, are formed sharing a common drain region 40. For memory cell 50, a first channel region 46a is defined in the substrate 10 by, and extends between, first source region 44a and the drain region 40. A first floating gate 14a (a first block of material remaining from first conductive layer 14) is disposed over and insulated from a first portion of the first channel region 46a (for controlling the conductivity thereof) adjacent first source region 44a, and preferably the first floating gate 14a is partially disposed over and insulated from first source region 44a by a respective remaining portion of oxide layer 12. A first coupling gate 18a (a first block of material remaining from second conductive layer 18) is disposed over and insulated from the first floating gate 14a by a respective remaining portion of second insulation layer 16 (for voltage coupling to the floating gate 14a). The fourth block of conductive material 34a is a first word line gate that is disposed vertically over and insulated from a second portion of the first channel region 46a (for controlling the conductivity thereof), and is laterally adjacent to and insulated from the first floating gate 14a by a respective remaining portion of oxide spacer 30. The second block of conductive material 38a is a first erase gate that is disposed vertically over and insulated from the first word line gate 34a by a respective remaining portion of oxide layer 36, and laterally adjacent to and insulated from the first coupling gate 18a by a combination of respective remaining portions of oxide layer 36 and insulation spacers 24, 26. The first erase gate 38a includes a notch 38c facing an edge 14c of the first floating gate 14a. Insulation block 20a (block of material remaining from insulation layer 20) is disposed over first coupling gate 18a.

For memory cell 52, a second channel region 46b is defined in the substrate 10 by, and extends between, source region 44b and the drain region 40. A second floating gate 14b (a second block of material remaining from first conductive layer 14) is disposed over and insulated from a first portion of the second channel region 46b (for controlling the conductivity thereof) adjacent source region 44b, and preferably the second floating gate 14b is partially disposed over and insulated from second source region 44b by a respective remaining portion of oxide layer 12. A second coupling gate 18b (a second block of material remaining from second conductive layer 18) is disposed over and insulated from the second floating gate 14b by a respective remaining portion of second insulation layer 16 (for voltage coupling to the floating gate 14b). The fifth block of conductive material 34b is a second word line gate that is disposed vertically over and insulated from a second portion of the second channel region 46b (for controlling the conductivity thereof), and is laterally adjacent to and insulated from the second floating gate 14b by a respective remaining portion of oxide spacer 30. The third block of conductive material 38b is a second erase gate that is disposed vertically over and insulated from the second word line gate 34b by a respective remaining portion of oxide layer 36, and laterally adjacent to and insulated from the second coupling gate 18b by a combination of respective remaining portions of oxide layer 36 and insulation spacers 24, 26. The second erase gate 38b includes a notch 38c facing an edge 14c of the second floating gate 14b. Insulation block 20b (block of material remaining from insulation layer 20) is disposed over second coupling gate 18b.

Table 1 below illustrates exemplary operational voltages and currents for program, read and erase operations of the memory cells 50 and 52.

TABLE 1

| | EG 38a | EG 38b | WLG 34a | WLG 34b | CG 18a | CG 18b | Source 44a | Source 44b | Drain 40 |
|---|---|---|---|---|---|---|---|---|---|
| Program Cell 50 | 4.5 V | 0 V | 1.0 V | 0 V | 10.5 V | 0 V | 4.5 V | 0 V | −1 uA |
| Program Cell 52 | 0 V | 4.5 V | 0 V | 1.0 V | 0 V | 10.5 V | 0 V | 4.5 V | −1 uA |
| Read Cell 50 | 0 V | 0 V | Vcc | 0 V | Vcc | 0 V | 0 V | 0 V | Vblr |
| Read Cell 52 | 0 V | 0 V | 0 V | Vcc | 0 V | Vcc | 0 V | 0 V | Vblr |
| Erase Cell 50 | 11.5 V | 0 V | 0 V | 0 V | 0 V | 0 V | 0 V | 0 V | 0 V |
| Erase Cell 52 | 0 V | 11.5 V | 0 V | 0 V | 0 V | 0 V | 0 V | 0 V | 0 V |

Vcc can be, for example, 0.9~3.3 V.
Vblr can be, for example, 0.5~1.1 V.

Programming memory cell 50 (i.e., programming first floating gate 14a with electrons) stores a first bit of information, and programming memory cell 52 (i.e., programming second floating gate 14b with electrons) stores a second bit of information. To program memory cell 50, a positive voltage of 4.5 V is applied to first erase gate 38a, a positive voltage of 1 V is applied to first word line gate 34a, a positive voltage of 10.5 V is applied to first coupling gate 18a, a positive voltage of 4.5 V is applied to first source region 44a, and a current of −1 uA is applied to the drain region 40. Electrons travel from drain region 40 toward first source region 44a in first channel region 46a, and inject themselves onto first floating gate 14a because of the positive voltage capacitively coupled to first floating gate 14a by first coupling gate 18a. Memory cell 52 is similarly programmed using the combination of voltages and current in Table 1.

To erase memory cell 50 (i.e., erasing first floating gate 14a by removing electrons therefrom), a positive voltage of 11.5 V is applied to the first erase gate 38a, which causes electrons to tunnel through the insulation layer 36 from the first floating gate 14a to the first erase gate 38a. Memory cell 52 is similarly erased by applying a positive voltage of 11.5 V to second erase gate 38b. Notches 38a facing edges 14c enhance the efficiency of this tunneling.

To read memory cell 50 (i.e., reading first floating gate 14a by determining the status of electrons thereon), positive voltages of Vcc (e.g., 0.9-3.3 V) are applied to first word line gate 34a and first coupling gate 18a, and a positive voltage of Vblr (e.g., 0.5-1.1 V) is applied to the drain region 40. Current will flow through the first channel region 46a if memory cell 50 is erased (i.e., first floating gate 14a is in an erased state and thus will have a positive voltage due to positive charge on first floating gate 14a after erasing and small voltage coupling from word line gate 34a and therefore the portion of the first channel region 46a under first floating gate 14a is turned on). Current is sensed as an erased stated. Current is reduced or will not flow through the first channel region 46a if first floating gate 14a is programmed (i.e. is programmed with electrons sufficient to prevent turning on the portion of the first channel region 46a under floating gate 14a). The low or no current is sensed as a programmed state. Memory cell 52 is similarly read using the combination of voltages in Table 1.

The formation and resulting structure of memory cells 50 and 52 have many advantages. The insulation (i.e., oxide layer 32) under the first and second word line gates 34a/34b can be much thinner than the insulation (i.e., oxide layer 12) under the first and second floating gates 14a/14b, for higher performance especially for high speed applications. The insulation (i.e., oxide layer 36) between the first and second floating gates 14a/14b and the first and second erase gates 38a/38b can be thinner than the insulation (i.e., oxide spacer 30) between the first and second floating gates 14a/14b and the first and second word line gates 34a/34b. The erase performance is enhanced because of the relatively low voltage coupling ratio between the first and second erase gates 38a/38b and the first and second floating gates 14a/14b (because only the corner regions of first and second erase gates 38a/38b (with notches 38c) are in close proximity to the corner regions (with edges 14c) of the first and second floating gates 14a/14b). Only two photolithography masking steps are needed to define the structure, one for forming trench 22, and one for etching through conductive layers 18 and 14 to complete the formation of first and second coupling gates 18a/18b and first and second floating gates 14a/14b. Both word line gates 34a/38b and first and second erase gates 38a/38b are self-aligned to the first and second floating gates 14a/14b. This self-alignment provide better control over the lengths of the first and second channel regions 46a/46b. Finally, the ability to scale the memory cells 50/52 to smaller sizes is facilitated by having the first and second coupling gates 18a/18b disposed over the first and second floating gates 14a/14b respectively, and having the first and second erase gates 38a/38b disposed over the first and second word line gates 34a/34b respectively.

Figure 7A:
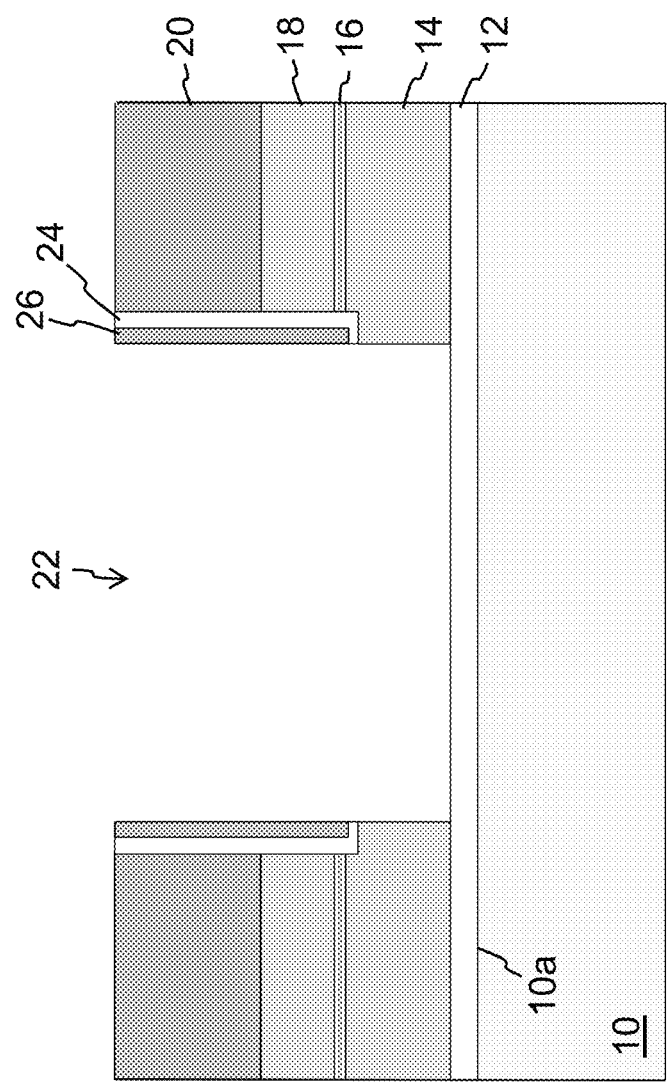
FIGS. 7A-7B are side cross section views showing the steps in forming a pair of memory cells according to an alternate embodiment of the present invention.
Figure 7B:
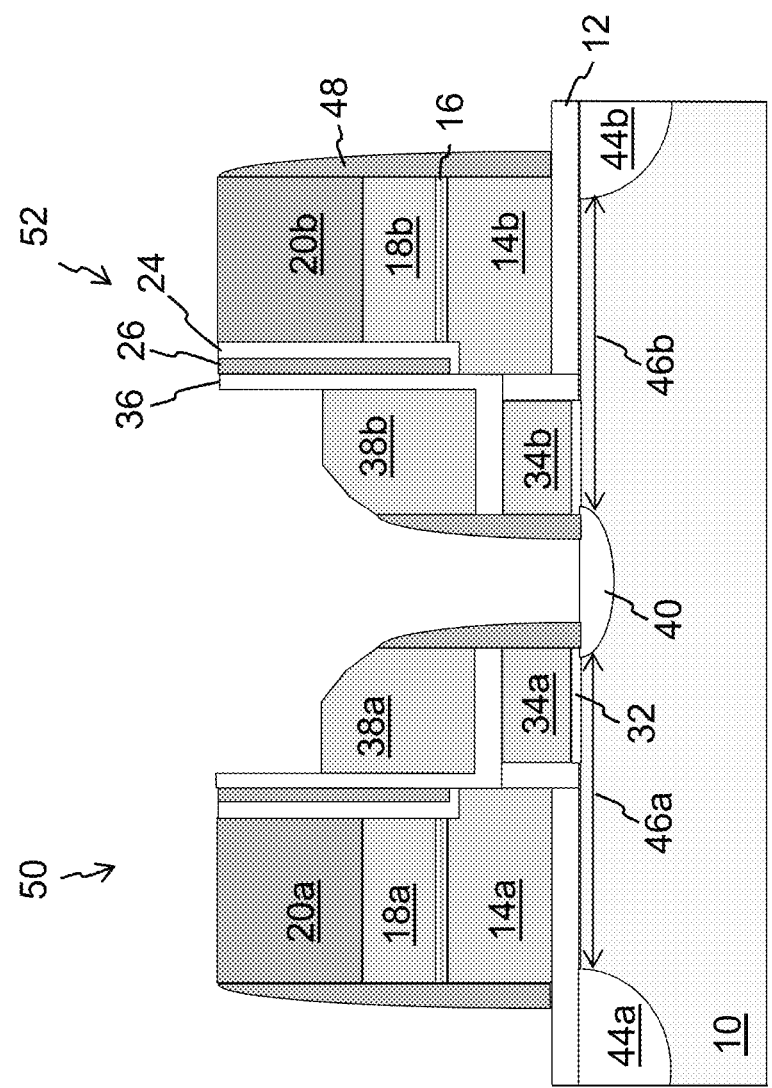

FIGS. 7A-7B illustrate an alternate embodiment for forming the memory cells 50/52, which starts with the structure of FIG. 5A. The above processing steps described with respect to FIG. 5B are performed, except the formation of oxide spacers 28 is omitted, resulting in the structure shown in FIG. 7A. Then, the remaining processing steps described above with respect to FIGS. 5C-5F are performed (except that the oxide spacers 28 are not removed because they were never formed), resulting in the final structure shown in FIG. 7B. The primary difference between this final structure and that of FIG. 6 is that notches are not formed in the erase gate. Instead, nitride spacers 26 are aligned with the sides of first and second floating gates 14a/14b, which means the sidewalls of trench 22 are planar when first and second erase gates 38a/38b are formed. Even though the lack of notches in the first and second erase gates 38a/38b may reduce erase efficiency, the memory cells 50/52 may be scaled down in size more than if the notches are formed and the lack of notches will reduce capacitive coupling between the first and second erase gates 38a/38b and the first and second floating gates 14a/14b.

Control circuitry 96 preferably (but not necessarily) formed on the same substrate 10 (as shown in FIG. 8) is configured to program, read and erase an array 98 of the memory cells 50 or 52 described herein by applying the voltages of Table 1 as described above.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell array of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a substrate of semiconductor material of a first conductivity type;
   first and second regions spaced apart in the substrate and having a second conductivity type different than the first conductivity type, with a first channel region in the substrate extending between the first and second regions;
   a first floating gate disposed over and insulated from a first portion of the first channel region adjacent to the second region;
   a first coupling gate disposed over and insulated from the first floating gate;
   a first word line gate disposed over and insulated from a second portion of the first channel region adjacent the first region;
   a first erase gate disposed over and insulated from the first word line gate;
   a third region in the substrate having the second conductivity type, with a second channel region in the substrate extending between the first and third regions;
   a second floating gate disposed over and insulated from a first portion of the second channel region adjacent to the third region;
   a second coupling gate disposed over and insulated from the second floating gate;
   a second word line gate disposed over and insulated from a second portion of the second channel region adjacent the first region; and
   a second erase gate disposed over and insulated from the second word line gate;
   wherein the first erase gate includes a notch facing an edge of the first floating gate, and the second erase gate includes a notch facing an edge of the second floating gate.

2. The memory device of claim 1, wherein the first floating gate is partially disposed over and insulated from the second region, and the second floating gate is partially disposed over and insulated from the third region.

3. A memory device, comprising:
   a substrate of semiconductor material of a first conductivity type;
   first and second regions spaced apart in the substrate and having a second conductivity type different than the first conductivity type, with a first channel region in the substrate extending between the first and second regions;
   a first floating gate disposed over and insulated from a first portion of the first channel region adjacent to the second region;
   a first coupling gate disposed over and insulated from the first floating gate;
   a first word line gate disposed over and insulated from a second portion of the first channel region adjacent the first region;
   a first erase gate disposed over and insulated from the first word line gate;
   a third region in the substrate having the second conductivity type, with a second channel region in the substrate extending between the first and third regions;
   a second floating gate disposed over and insulated from a first portion of the second channel region adjacent to the third region;
   a second coupling gate disposed over and insulated from the second floating gate;
   a second word line gate disposed over and insulated from a second portion of the second channel region adjacent the first region; and
   a second erase gate disposed over and insulated from the second word line gate;
   wherein insulation between the first word line gate and the substrate is thinner than insulation between the first floating gate and the substrate, and wherein insulation between the second word line gate and the substrate is thinner than insulation between the second floating gate and the substrate.

4. A memory device, comprising:
   a substrate of semiconductor material of a first conductivity type;
   first and second regions spaced apart in the substrate and having a second conductivity type different than the first conductivity type, with a first channel region in the substrate extending between the first and second regions;
   a first floating gate disposed over and insulated from a first portion of the first channel region adjacent to the second region;

a first coupling gate disposed over and insulated from the first floating gate;

a first word line gate disposed over and insulated from a second portion of the first channel region adjacent the first region;

a first erase gate disposed over and insulated from the first word line gate;

a third region in the substrate having the second conductivity type, with a second channel region in the substrate extending between the first and third regions;

a second floating gate disposed over and insulated from a first portion of the second channel region adjacent to the third region;

a second coupling gate disposed over and insulated from the second floating gate;

a second word line gate disposed over and insulated from a second portion of the second channel region adjacent the first region; and a second erase gate disposed over and insulated from the second word line gate;

wherein insulation between the first erase gate and the first floating gate is thinner than insulation between the first word line gate and the first floating gate, and wherein insulation between the second erase gate and the second floating gate is thinner than insulation between the second word line gate and the second floating gate.

5. The memory device of claim 1, wherein:

the first word line gate is disposed laterally adjacent to and insulated from the first floating gate;

the first erase gate is disposed laterally adjacent to and insulated from the first coupling gate;

the second word line gate is disposed laterally adjacent to and insulated from the second floating gate; and the second erase gate is disposed laterally adjacent to and insulated from the second coupling gate.

6. A memory device, comprising:

a substrate of semiconductor material of a first conductivity type;

first and second regions spaced apart in the substrate and having a second conductivity type different than the first conductivity type, with a first channel region in the substrate extending between the first and second regions;

a first floating gate disposed over and insulated from a first portion of the first channel region adjacent to the second region;

a first coupling gate disposed over and insulated from the first floating gate;

a first word line gate disposed over and insulated from a second portion of the first channel region adjacent the first region;

a first erase gate disposed over and insulated from the first word line gate; and control circuitry configured to:
  program the first floating gate by applying positive voltages to the first erase gate, the first word line gate, the first coupling gate and the second region, and a current to the first region;
  read the first floating gate by applying positive voltages to the first word line gate, the first coupling gate and the first region; and
  erase the first floating gate by applying a positive voltage to the first erase gate.

7. The memory device of claim 3, wherein:

the first word line gate is disposed laterally adjacent to and insulated from the first floating gate;

the first erase gate is disposed laterally adjacent to and insulated from the first coupling gate;

the second word line gate is disposed laterally adjacent to and insulated from the second floating gate; and the second erase gate is disposed laterally adjacent to and insulated from the second coupling gate.

8. The memory device of claim 4, wherein:

the first word line gate is disposed laterally adjacent to and insulated from the first floating gate;

the first erase gate is disposed laterally adjacent to and insulated from the first coupling gate;

the second word line gate is disposed laterally adjacent to and insulated from the second floating gate; and the second erase gate is disposed laterally adjacent to and insulated from the second coupling gate.

* * * * *